United States Patent
Pyun et al.

(10) Patent No.: US 11,283,449 B2
(45) Date of Patent: Mar. 22, 2022

(54) INTERFACE SYSTEM AND DISPLAY DEVICE INCLUDING THE SAME

(71) Applicant: Samsung Display Co., Ltd., Yongin-si (KR)

(72) Inventors: Ki Hyun Pyun, Yongin-si (KR); Won Jin Seo, Yongin-si (KR); Eun Jin Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/087,476

(22) Filed: Nov. 2, 2020

(65) Prior Publication Data

US 2021/0281263 A1 Sep. 9, 2021

(30) Foreign Application Priority Data

Mar. 3, 2020 (KR) .......................... 10-2020-0026717

(51) Int. Cl.
*H03K 19/0175* (2006.01)
*G09G 3/3233* (2016.01)
*H04B 1/04* (2006.01)

(52) U.S. Cl.
CPC ... *H03K 19/017509* (2013.01); *G09G 3/3233* (2013.01); *H04B 1/0458* (2013.01); *G09G 2300/0876* (2013.01)

(58) Field of Classification Search
None
See application file for complete search history.

(56) References Cited

U.S. PATENT DOCUMENTS

| | | | |
|---|---|---|---|
| 7,333,778 B2 | 2/2008 | Pehlke et al. | |
| 8,054,306 B2 * | 11/2011 | Chiang | G09G 3/3655 345/211 |
| 9,076,398 B2 * | 7/2015 | Su | G09G 3/2092 |
| 9,240,774 B2 | 1/2016 | Gohel | |
| 9,728,129 B2 | 8/2017 | Lee et al. | |
| 2006/0097969 A1 * | 5/2006 | Tsai | G09G 3/20 345/88 |
| 2007/0024560 A1 * | 2/2007 | Kim | G09G 3/3655 345/94 |
| 2017/0148369 A1 * | 5/2017 | Park | G09G 3/2007 |

FOREIGN PATENT DOCUMENTS

| | | | |
|---|---|---|---|
| KR | 10-2004-0051975 A | 6/2004 | |
| KR | 10-2016-0048265 A | 5/2016 | |

* cited by examiner

*Primary Examiner* — Matthew Yeung
(74) *Attorney, Agent, or Firm* — Lewis Roca Rothgerber Christie LLP

(57) ABSTRACT

An interface system including: a receiver; a transmitter configured to transmit a signal including a common mode voltage to the receiver through transmission lines; and a plurality of bias circuits configured to adjust the common mode voltage of the signal, wherein the bias circuits are configured to receive a bias control bit to generate a biased common mode voltage.

16 Claims, 8 Drawing Sheets

<White Data Case>        <Black Data Case>

<White Data Case>

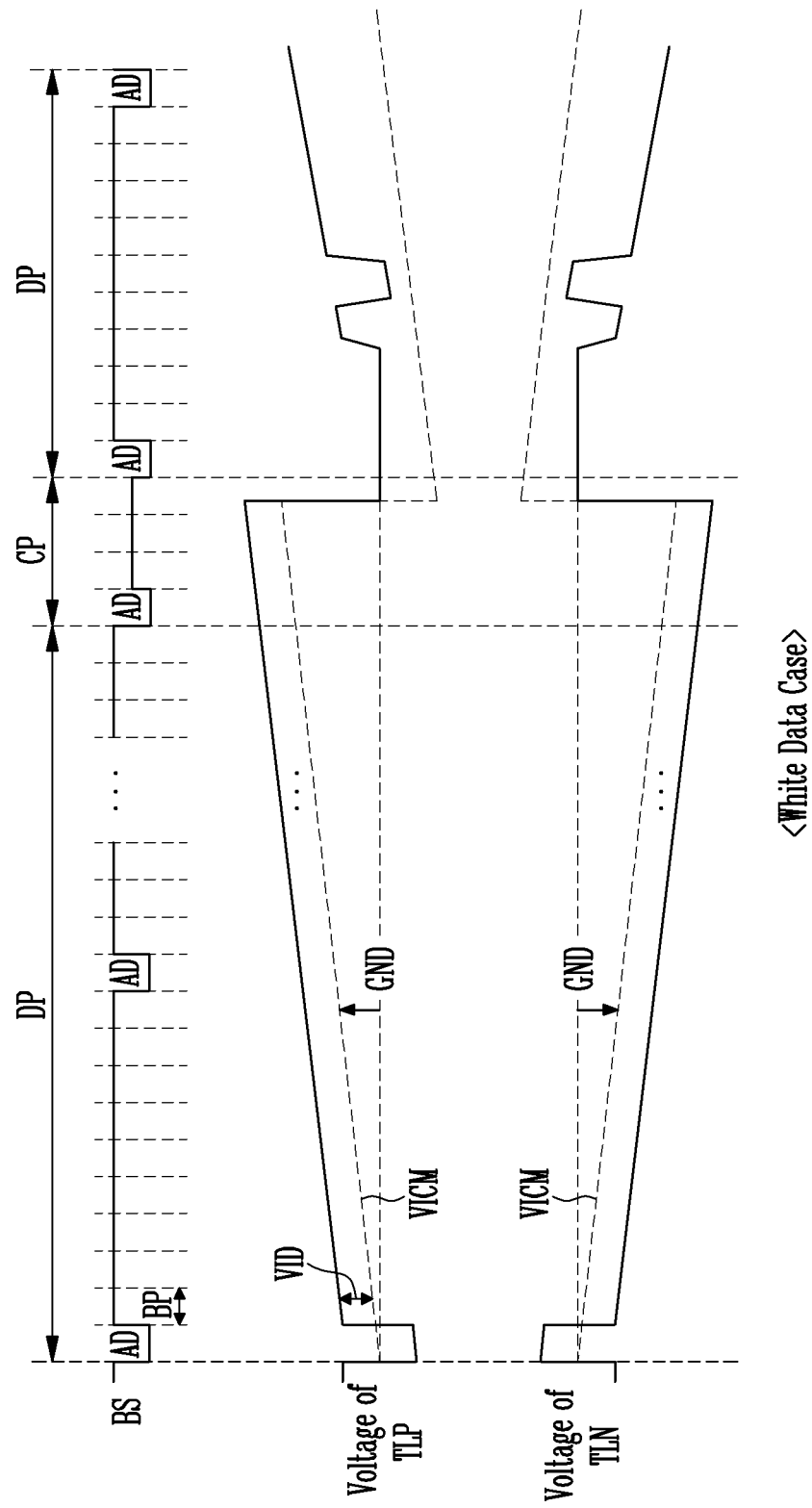

INTERFACE SYSTEM AND DISPLAY DEVICE INCLUDING THE SAME

CROSS-REFERENCE TO RELATED APPLICATION

The present application claims priority to and the benefit of Korean Patent Application No. 10-2020-0026717, filed Mar. 3, 2020, the entirety of which is hereby incorporated by reference for all purposes as if fully set forth herein.

BACKGROUND

1. Field

Aspects of some example embodiments of the present invention relate to an interface system and a display device including the same.

2. Discussion

With the development of information technology, display devices, which provide a connection medium between users and information, have grown in importance. In response to this, the use of display devices such as a liquid crystal display device, a plasma display device, an organic light emitting display device, and the like has increased over time.

In general, a display device includes a plurality of pixels, a data driving integrated circuit (DDI) for driving the pixels, and a timing controller (TCON) for controlling the data driving IC.

The plurality of pixels may emit light with luminance corresponding to the supplied data signals, and the data driving IC may supply the data signals to the plurality of pixels. The timing controller may transmit the data signals, a synchronization signal, a protocol signal, and the like to the data driving IC. In this case, the timing controller and the data driving IC may communicate with each other through an interface system.

For example, a USI (Universal Serial Interface) module or a USI-T module may be used as the interface system for the display device.

The interface system may include a transmitter (TX) and a receiver (RX), and the transmitter and the receiver may reliably communicate under conditions where input common mode voltage (VICM) and input differential voltage (VID) correspond to each other.

In this case, an AC coupling capacitor for minimizing or reducing a direct current component of a signal may be connected to a transmission line, so that common mode voltages of the transmitter and the receiver can be matched with each other.

The above information disclosed in this Background section is only for enhancement of understanding of the background and therefore the information discussed in this Background section does not necessarily constitute prior art.

SUMMARY

Aspects of some example embodiments according to the present disclosure may include an interface system in which communication performance can be improved by periodically compensating for a common mode voltage of a transmitter or a receiver, and a display device including the same.

The technical characteristics of embodiments according to the present invention are not limited to the above-mentioned technical characteristics, and other technical problems not mentioned will be clearly understood by those skilled in the art from the following description.

According to some example embodiments, an interface system according to the present invention may include: a receiver; a transmitter transmitting a signal including a common mode voltage to the receiver through transmission lines; and bias circuits for adjusting the common mode voltage of the signal, and the bias circuits may receive a bias control bit to generate a biased common mode voltage.

According to some example embodiments, the interface system may further include a balance voltage detector for detecting voltages of the transmission lines.

According to some example embodiments, the balance voltage detector may include comparators that compare the voltages of the transmission lines with a reference voltage input from outside.

According to some example embodiments, the comparators may include: a first comparator comparing a voltage of one of the transmission lines with a first reference voltage that is a positive voltage input from the outside; and a second comparator comparing a voltage of other one of the transmission lines with a second reference voltage that is a negative voltage input from the outside.

According to some example embodiments, the first comparator and the second comparator may be amplifiers, a voltage of a first transmission line, which is the one of the transmission lines, may be input to a non-inverting terminal of the first comparator, and the first reference voltage may be input to an inverting terminal of the first comparator, and a voltage of a second transmission line, which is the other one of the transmission lines, may be input to an inverting terminal of the second comparator, and the second reference voltage may be input to a non-inverting terminal of the second comparator.

According to some example embodiments, the interface system may further include: a first switch connecting the non-inverting terminal of the first comparator and the first transmission line; and a second switch connecting the inverting terminal of the second comparator and the second transmission line.

According to some example embodiments, the first switch may be turned on in response to a balance failure signal provided from the receiver, and the second switch may be turned on in response to a balance check enable signal provided from the transmitter.

According to some example embodiments, the interface system may further include a bias control unit receiving voltages output from the balance voltage detector and the reference voltage input from the outside to control the bias circuits.

According to some example embodiments, the bias control unit may include a bias controller that controls the bias circuits to generate the biased common mode voltage.

According to some example embodiments, the balance voltage detector may detect the voltages of the transmission lines every compensation period having periodicity.

According to some example embodiments, the compensation period may be included in a period in which image data is transmitted.

According to some example embodiments, the transmission lines may include a first transmission line for transmitting a signal of a first phase and a second transmission line for transmitting a signal of a second phase different from the first phase.

According to some example embodiments, the transmitter may communicate with the receiver in a differential signal method.

According to some example embodiments, the interface system may further include a coupling selection circuit selectively providing signals transmitted through the transmission lines to one of the bias circuits and the transmitter in response to a coupling control signal generated from the transmitter.

According to some example embodiments, the signal input to the receiver may increase or decrease, and then decrease or increase at a predetermined voltage or higher.

A display device according to some example embodiments of the present invention may include: a pixel unit including pixels; a data driver providing data signals to the pixels and including a receiver; a timing controller including a transmitter transmitting a signal including a common mode voltage to the receiver through transmission lines; and a balance voltage detector for detecting voltages of the transmission lines of the signal including the common mode voltage, and the balance voltage detector may detect the voltages every compensation period having periodicity.

According to some example embodiments, the display device may further include bias circuits for adjusting the common mode voltage of the signal including the common mode voltage.

BRIEF DESCRIPTION OF THE DRAWINGS

The accompanying drawings, which are included to provide a further understanding of the inventive concepts, and are incorporated in and constitute a part of this specification, illustrate aspects of some example embodiments of the inventive concepts, and, together with the description, serve to explain principles of the inventive concepts.

FIG. 10 is a timing diagram illustrating a method of driving an interface system according to some example embodiments of the present invention.

DETAILED DESCRIPTION

Figure 1:
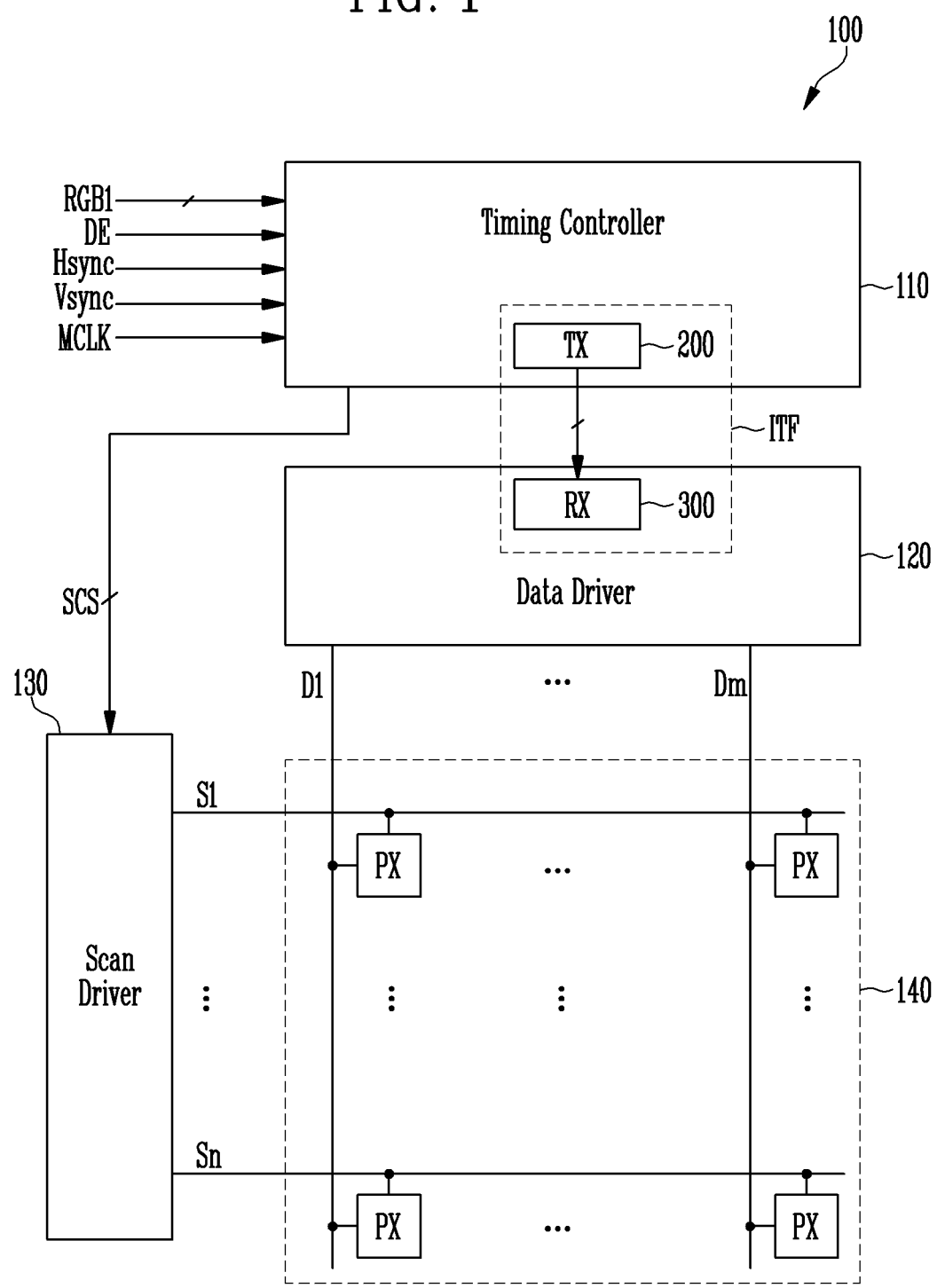
FIG. 1 is a block diagram illustrating a display device according to some example embodiments of the present invention.

Aspects and characteristics of some example embodiments of the present invention, and methods for accomplishing the same will be more clearly understood from example embodiments described below with reference to the accompanying drawings. However, embodiments according to the present invention are not limited to the following example embodiments but may be implemented in various different forms. The example embodiments are provided only to complete the disclosure of the present invention and to more fully inform a person having ordinary skill in the art to which the present invention pertains the scope of embodiments according to the present invention. Embodiments according to the present invention are defined by the scope of the appended claims and their equivalents.

Although the terms first, second, etc. may be used herein to describe various components, these components should not be limited by these terms. These terms are only used to distinguish one component from another component. Thus, a first component discussed below may be a second component within the technical spirit of the present invention. Singular expressions may include plural expressions unless the context clearly indicates otherwise.

Hereinafter, aspects of some example embodiments of the present invention will be described in more detail with reference to the accompanying drawings. The same or similar reference numerals are used for the same components in the drawings.

FIG. 1 is a block diagram illustrating a display device according to some example embodiments of the present invention.

Referring to FIG. 1, a display device 100 may include a timing controller 110, a data driver 120, an interface system ITF, a scan driver 130, and a pixel unit 140.

The timing controller 110 may control the overall operation of the display device 100.

The timing controller 110 may receive image data RGB1 and external control signals from outside (e.g., from an external source). For example, the external control signals may include a vertical synchronization signal Vsync, a horizontal synchronization signal Hsync, a main clock signal MCLK, a data enable signal DE, and the like.

The timing controller 110 may process the image data RGB1 and the external control signals to suit operating conditions of the data driver 120, the scan driver 130, and the pixel unit 140 and generate processed image data, clock signals, and the like.

The timing controller 110 may include a transmitter TX and 200 of the interface system ITF.

The timing controller 110 may communicate with the data driver 120 through the interface system ITF. For example, the timing controller 110 may transmit the processed image data, clock signals, and the like to the data driver 120 through the interface system ITF.

The timing controller 110 may output a scan control signal SCS to the scan driver 130. For example, the scan control signal SCS may include a scan start signal, a plurality of clock signals, and the like.

According to some example embodiments, the interface system ITF may be implemented as a USI module, a USI-T module, or the like.

The data driver 120 may include a receiver RX and 300 of the interface system ITF. For example, the transmitter 200 and the receiver 300 may be connected to each other through transmission lines.

The data driver 120 may receive the processed image data, clock signals, and the like from the timing controller 110 through the interface system ITF.

The data driver 120 may supply data signals to data lines D1 to Dm based on the processed image data, clock signals, and the like, where m is a natural number. For example, the data driver 120 may supply the data signals to the data lines D1 to Dm in synchronization with scan signals corresponding to the data signals.

For example, the receiver 300 may include a clock data recovery (CDR) circuit, an equalizer, and the like.

According to some example embodiments, the data driver 120 may be mounted on the display device 100 in the form of a data driving IC.

The scan driver 130 may receive the scan control signal SCS.

The scan driver 130 may supply the scan signals to scan lines S1 to Sn based on the scan control signal SCS, where n is a natural number. For example, the scan driver 130 may sequentially supply the scan signals to the scan lines S1 to Sn.

The pixel unit 140 may include a substrate and a plurality of pixels PX arranged (e.g., in a matrix arrangement) on the substrate. For example, the pixel unit 140 may refer to a display area of a display panel.

The pixels PX may be connected to corresponding data lines D1 to Dm and scan lines S1 to Sn, and may be supplied with the data signals and the scan signals through the data lines D1 to Dm and the scan lines S1 to Sn.

The pixels PX may be respectively arranged in regions where the scan lines S1 to Sn and the data lines D1 to Dm intersect.

The pixels PX may emit light with grayscales corresponding to the data signals.

The pixel unit 140 may further include the scan lines S1 to Sn and the data lines D1 to Dm. According to some example embodiments, the scan lines S1 to Sn may extend in a first direction (for example, a horizontal direction), and the data lines D1 to Dm may extend in a second direction (for example, a vertical direction) different from the first direction.

According to some example embodiments, any one of the pixels PX may be connected to at least one of the scan lines S1 to Sn and at least one of the data lines D1 to Dm.

According to some example embodiments, each of the pixels PX may include a first transistor (for example, a switching transistor) connected to the scan lines S1 to Sn and the data lines D1 to Dm, a second transistor (for example, a driving transistor) connected to the first transistor, and a light emitting element. Hereinafter, for convenience of description, the light emitting element is described as being an organic light emitting diode. However, embodiments according to the present invention are not limited thereto.

A first electrode of the first transistor may be connected to any one of the data lines D1 to Dm, and a second electrode of the first transistor may be connected to the second transistor. In addition, a gate electrode of the first transistor may be connected to any one of the scan lines S1 to Sn.

A first electrode of the second transistor may be connected to a first power source, and a second electrode of the second transistor may be connected to an anode electrode of the light emitting element. In addition, a gate electrode of the second transistor may be connected to the second electrode of the first transistor.

The anode electrode of the light emitting element may be connected to the second electrode of the second transistor, and a cathode electrode of the light emitting element may be connected to a second power source.

The light emitting element may emit light at a luminance corresponding to a driving current flowing from the first power source to the second power source.

The second transistor may control the driving current flowing from the first power source to the second power source via the light emitting element according to a data signal transferred through the first transistor.

Embodiments according to the present invention are not limited thereto, and the structure of each of the pixels PX may be variously changed according to embodiments.

According to some example embodiments, each of the pixels PX may include a red sub-pixel that emits light of a first color (for example, red), a green sub-pixel that emits light of a second color (for example, green), and a blue sub-pixel that emits light of a third color (for example, blue).

Figure 2:
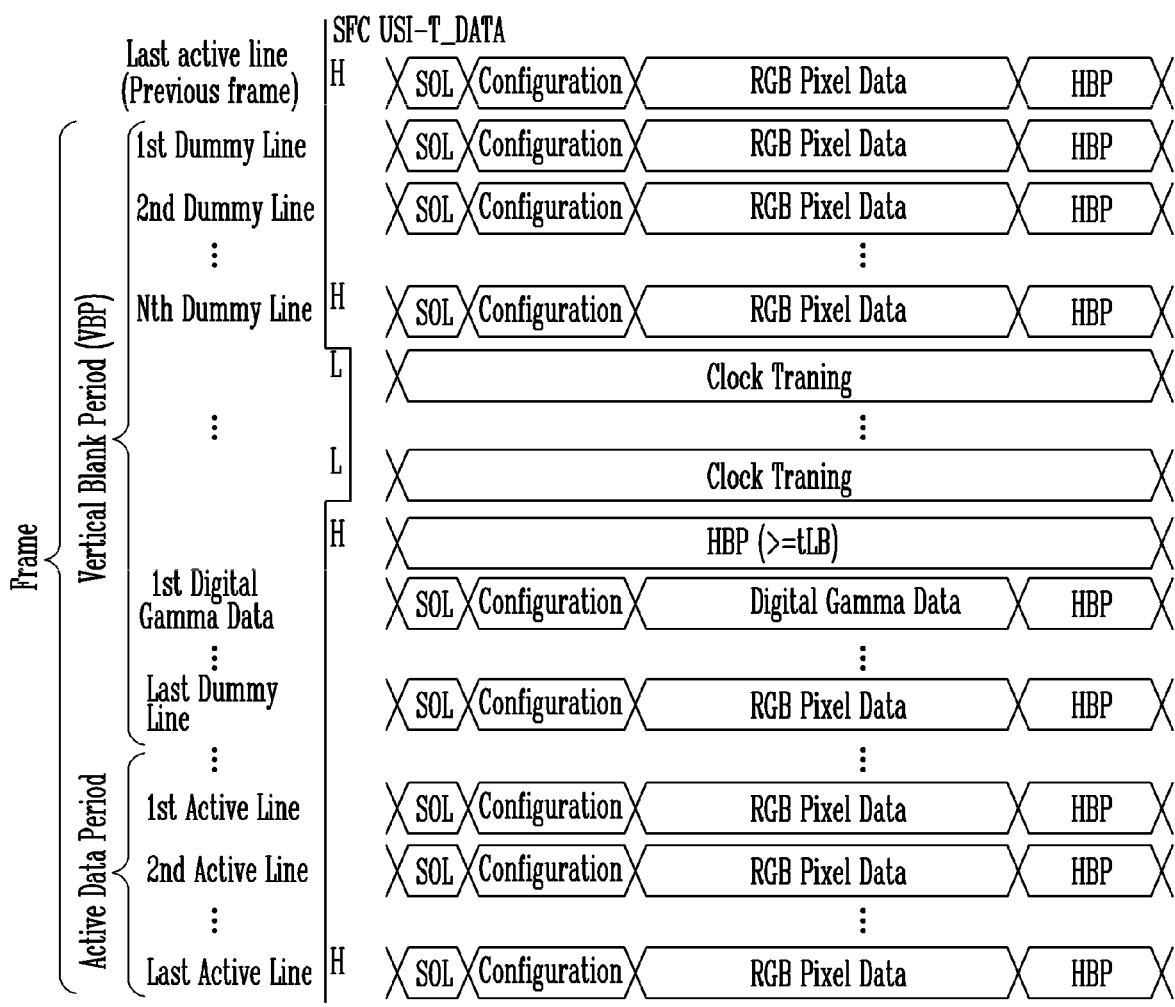
FIG. 2 is a diagram illustrating an example of a configuration of one frame.

FIG. 2 is a diagram illustrating an example of a configuration of one frame.

Referring to FIGS. 1 and 2, the display device 100 may be driven according to consecutive frames, and each frame period may include an active data period and a vertical blank period. The active data period and the vertical blank period may be configured in units of horizontal line periods.

According to some example embodiments, the timing controller 110 may transmit image data embedded with a clock signal to the data driver 120.

When a frame control signal SFC is at a low level, clock signals of the transmitter 200 and the receiver 300 may be synchronized. For example, when the frame control signal SFC is at the low level, the CDR circuit of the receiver 300 may be synchronized (that is, phase locked) with the clock signal of the transmitter 200 by restoring a reference clock.

When the frame control signal SFC is at a high level, each horizontal line period may be composed of a start line period SOL, a setting period Configuration, an image data period RGB Pixel Data, and a horizontal blank period HBP.

Figure 3:
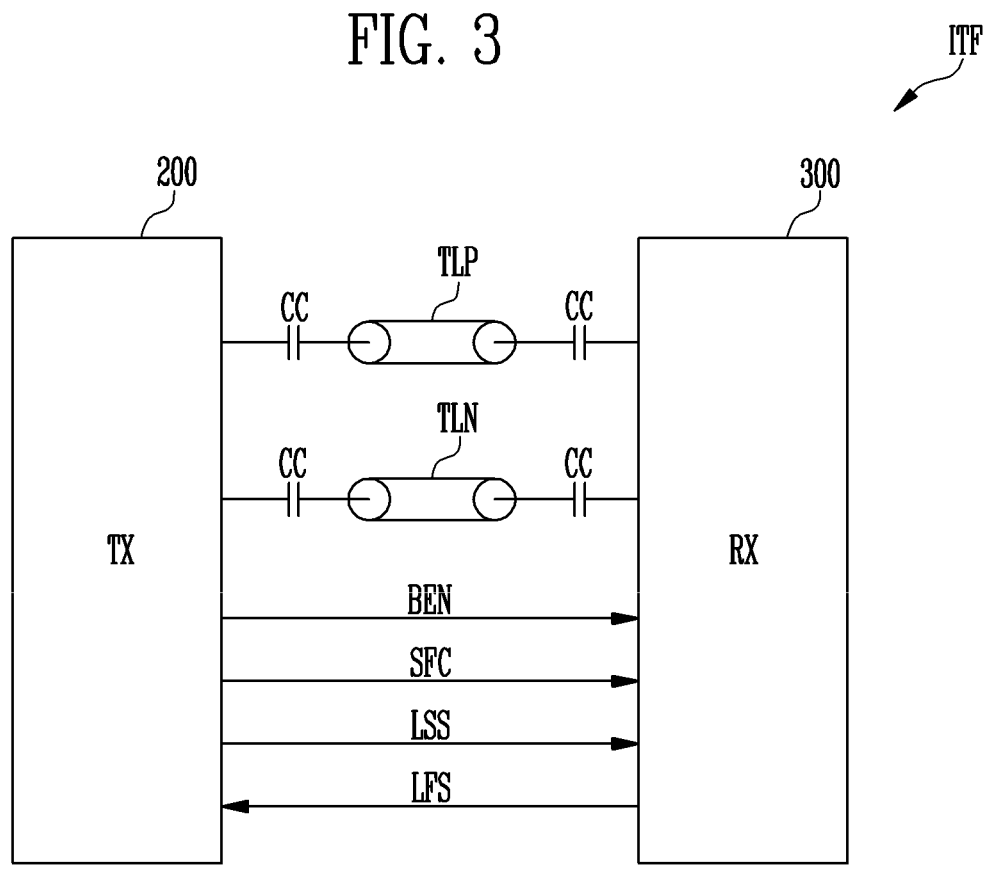
FIG. 3 is a diagram illustrating an interface system according to some example embodiments of the present invention.

FIG. 3 is a diagram illustrating an interface system according to some example embodiments of the present invention.

According to some example embodiments, the interface system ITF may be the USI-T interface module.

Referring to FIG. 3, the interface system ITF may include the transmitter 200 and the receiver 300 connected to the transmission lines.

According to some example embodiments, the transmitter 200 may be included in the timing controller 110 (refer to FIG. 1), and the receiver 300 may be included in the data driver 120 (refer to FIG. 1).

The transmitter 200 may communicate with the receiver 300 in a differential signal method. That is, the transmission lines may include a first transmission line TLP for transmitting a signal of a first phase and a second transmission line TLN for transmitting a signal of a second phase different from the first phase. The transmitter 200 may transmit the data signals through the first transmission line TLP and the second transmission line TLN.

According to some example embodiments, the first phase and the second phase may be opposite to each other.

Each of the first transmission line TLP and the second transmission line TNL may include at least one coupling capacitor CC. Although four coupling capacitors CC are shown in FIG. 3, embodiments according to the present invention are not limited thereto.

The coupling capacitor CC may be connected in series to each of the first transmission line TLP and the second transmission line TNL. The coupling capacitor CC may minimize DC components of the data signals transmitted through the first transmission line TLP and the second transmission line TNL. Accordingly, even when the specifications of each of the transmitter 200 and the receiver 300 are different, the transmitter 200 can stably communicate with the receiver 300.

The transmitter 200 may transmit a reset signal BEN, the frame control signal SFC, and a lock start signal LSS to the receiver 300.

In addition, according to some example embodiments, when the transmitter 200 is powered-on, a data signal having a Worst Pattern may be transmitted to the receiver 300. In addition, while the data signal is being transmitted, the transmitter 200 may transmit the lock start signal LSS to the receiver 300.

The Worst Pattern may be any one of a white pattern and a black pattern.

The receiver 300 may reset common mode voltages of the first transmission line TLP and the second transmission line TNL according to the reset signal BEN.

In addition, the receiver 300 may transmit a lock failure signal LFS to the transmitter 200.

Figure 4:
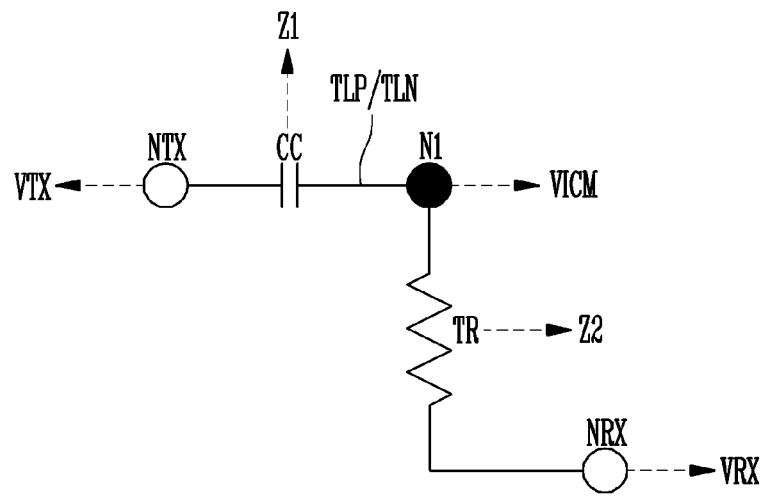
FIG. 4 is a diagram schematically illustrating structures of first and second transmission lines shown in FIG. 3.

FIG. 4 is a diagram schematically illustrating structures of first and second transmission lines shown in FIG. 3.

In this specification, a common mode voltage (VICM; Input Common Mode Voltage) and a differential voltage (VID; Input Differential Voltage) (refer to FIG. 5) may refer to voltages used as a criterion for determining bit values. For example, when the common mode voltage VICM of the first transmission line TLP is 1 V and the differential voltage VID of the first transmission line TLP is 0.5 V, 1.5 V may refer to a first bit value (for example, 1) and 0.5 V may refer to a second bit value (for example, 2).

As such, the common mode voltage VICM and the differential voltage VID may be important in communication between the transmitter 200 and the receiver 300. However, the common mode voltage VICM may be changed.

Referring to FIGS. 3 and 4, the first and second transmission lines TLP and TLN may include a coupling capacitor CC and a receiver resistor TR connected between a transmitter node NTX and a receiver node NRX. For convenience of description, only one coupling capacitor CC is shown in FIG. 4, but embodiments according to the present invention are not limited thereto.

Specifically, the coupling capacitor CC may be connected between a first node N1 and the transmitter node NTX, and the receiver resistor TR may be connected between the first node N1 and the receiver node NRX. In this case, a voltage of the first node N1 may represent the common mode voltage VICM.

Therefore, the common mode voltage VICM may be calculated according to Equation 1 below.

$$VICM=(VTX-VRX)*(Z2)/(Z1+Z2)$$ [Equation 1]

Here, VICM refers to the common mode voltage, VTX refers to a voltage of the transmitter node NTX, VRX refers to a voltage of the receiver node NRX, Z1 refers to an impedance of the coupling capacitor CC, and Z2 refers to an impedance of the receiver resistor TR.

Accordingly, when a frequency value of the data signal increases (that is, when a high level value and a low level value included in the data signal are uniform), the common mode voltage VICM may converge to 0.

However, when the frequency value of the data signal decreases (that is, when the high level value and the low level value included in the data signal are not uniform), the common mode voltage VICM may rise or fall.

When the common mode voltage VICM rises or falls, the CDR circuit of the receiver 300 may fail to synchronize (that is, lock) with data and clock signal of the transmitter 200. In this specification, this phenomenon is defined as a balance failure.

Figure 5:
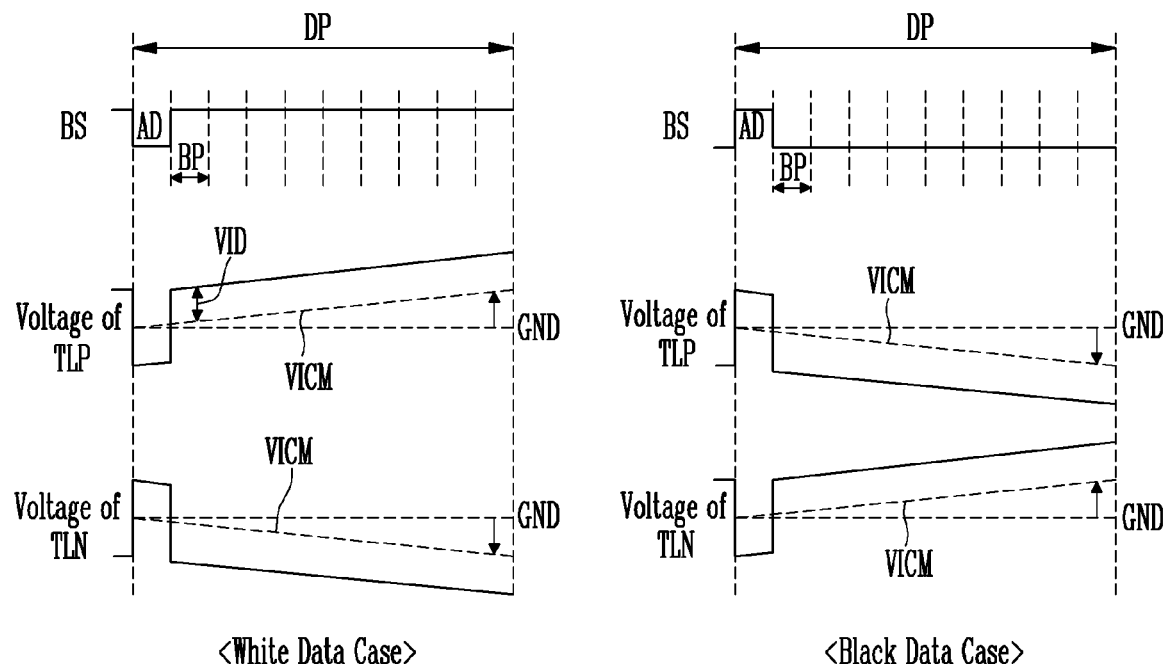
FIG. 5 is a diagram illustrating a change in a common mode voltage according to a data signal.

FIG. 5 is a diagram illustrating a change in a common mode voltage according to a data signal.

Referring to FIGS. 3 and 5, for example, an image data period DP may include 10 bit periods BP. For convenience of description, one data signal BS corresponding to the image data period DP is shown to include 10 bits corresponding to the bit period BP. However, embodiments according to the present invention are not limited thereto.

First, the timing diagram shown on the left shows a case where the data signal BS has a white pattern representing white grayscale.

In this case, the data signal BS having the white pattern may include nine high level bits and one low level bit (for example, a reference bit AD). Here, the reference bit AD may refer to a bit arbitrarily set regardless of grayscale.

As the data signal BS having the white pattern is supplied, the common mode voltage VICM of the first transmission line TLP may rise. Conversely, the common mode voltage VICM of the second transmission line TLN may fall.

Next, the timing diagram shown on the right shows a case where the data signal BS has a black pattern representing black grayscale.

In this case, the data signal BS having the black pattern may include one high level bit (for example, the reference bit AD) and nine low level bits.

As the data signal BS having the black pattern is supplied, the common mode voltage VICM of the first transmission line TLP may fall. Conversely, the common mode voltage VICM of the second transmission line TLN may rise.

As shown in FIG. 5, when the common mode voltage VICM rises or falls, the CDR circuit of the receiver 300 may fail to synchronize (that is, lock) with the data and clock signal of the transmitter 200. Therefore, the balance failure may occur.

Figure 6:
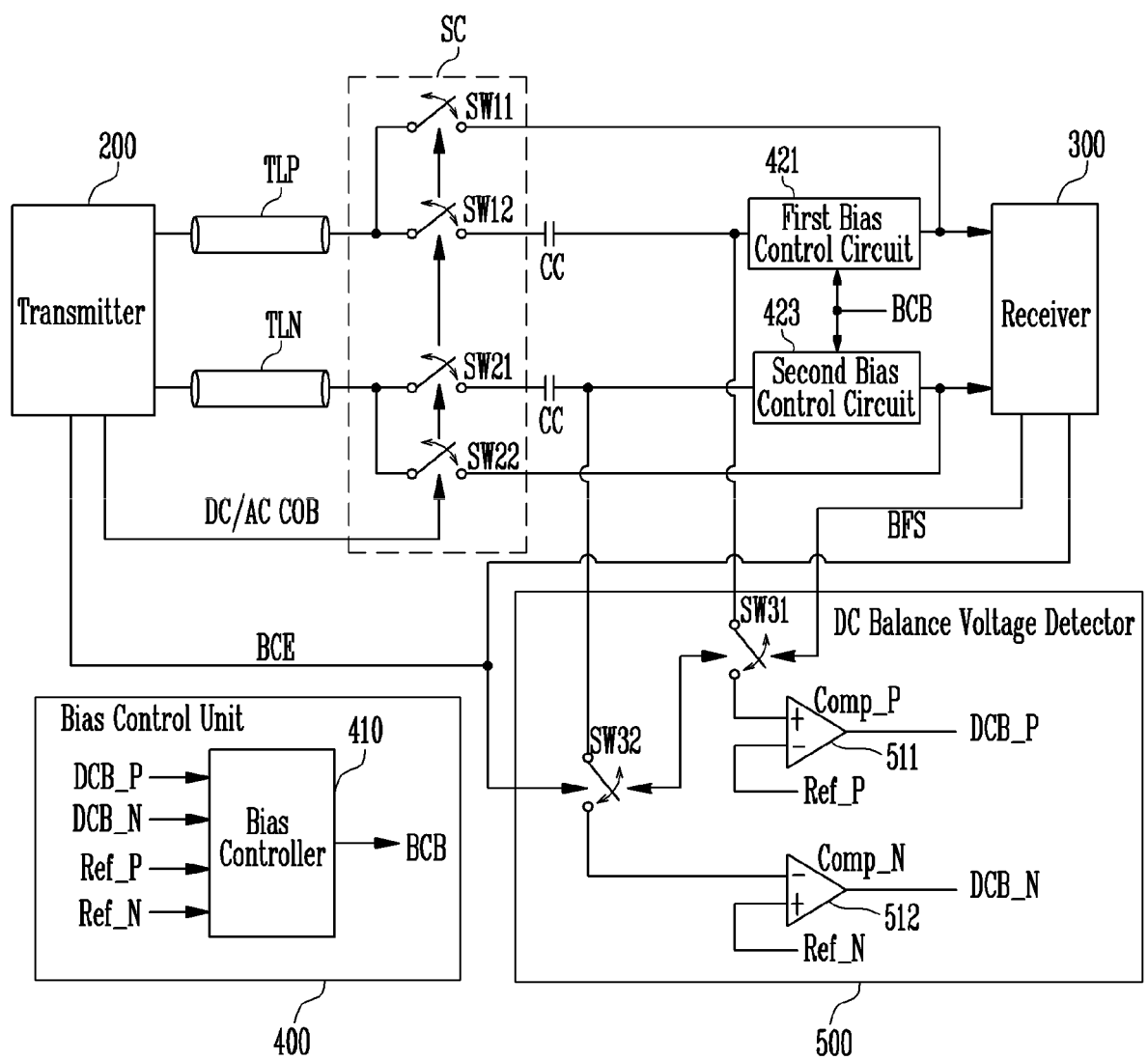
FIG. 6 is a diagram illustrating in detail the interface system according to some example embodiments of the present invention.

FIG. 6 is a diagram illustrating in detail the interface system according to some example embodiments of the present invention.

Referring to FIG. 6, the interface system may include the transmitter 200, the receiver 300, the first transmission line TLP, the second transmission line TLN, a coupling selection circuit SC, a bias control unit 400, a balance voltage detector 500, a first bias control circuit 421, and a second bias control circuit 423.

A receiving circuit connected to the receiver 300 may be operated in any one of a DC coupling mode and an AC coupling mode according to common mode voltages VICM of signals transmitted through the first transmission line TLP and the second transmission line TTL.

The coupling selection circuit SC may selectively provide the signals transmitted through the first transmission line TLP and the second transmission line TLN to any one of the first and second bias control circuits 421 and 423 and the receiver 300 in response to a coupling control signal DC/AC COB generated from the transmitter 200. For example, when the coupling control signal DC/AC COB is a first level (that is, a high level), the coupling selection circuit SC may transmit a signal to the first and second bias control circuits 421 and 423. When the coupling control signal DC/AC COB is a second level (that is, a low level), the coupling selection circuit SC may transmit the signal as a differential signal to the receiver 300.

The coupling selection circuit SC may include switches SW11, SW12, SW21, and SW22. In response to the coupling control signal DC/AC COB, the switches SW11, SW12, SW21, and SW22 may allow the first transmission line TLP and the second transmission line TLN to be connected to the receiver 300 through the first and second bias control circuits 421 and 423, respectively, or the first transmission line TLP and the second transmission line TLN to be directly connected to the receiver 300.

For example, when the coupling control signal DC/AC COB is the first level, the switches SW12 and SW21 may be turned on, and the switches SW11 and SW22 may be turned off. Therefore, an AC coupling operation may be performed by the coupling capacitor CC connected to the first and second bias control circuits 421 and 423. Accordingly, even if the common mode voltage of the transmitter 200 and the common mode voltage set in the receiver 300 are different from each other, the differential signal in which the common mode voltage is adjusted by the first and second bias control circuits 421 and 423 may be provided to the receiver 300.

For example, when the coupling control signal DC/AC COB is the second level, the switches SW11 and SW22 may be turned on and the switches SW12 and SW21 may be turned off. Therefore, a DC coupling operation in which a signal is directly transmitted to the receiver 300 as the differential signal may be performed. When the common mode voltage of the transmitter 200 and the common mode voltage set in the receiver 300 are the same, operations of the first and second bias control circuits 421 and 423 may be unnecessary.

The first bias control circuit 421 may output a first biased signal in which a voltage level of a first received signal received through the first transmission line TLP and the coupling capacitor CC is increased (or decreased) by a DC bias voltage (e.g., a set or predetermined DC bias voltage), to the receiver 300. The first bias control circuit 421 may receive the common mode voltage and output a first biased common mode voltage.

The second bias control circuit 423 may output a second biased signal in which a voltage level of a second received signal received through the second transmission line TLN and the coupling capacitor CC is increased (or decreased) by the DC bias voltage (e.g., the set or predetermined DC bias voltage), to the receiver 300. The second bias control circuit 423 may receive the common mode voltage and output a second biased common mode voltage.

According to some example embodiments, the DC bias voltage set in each of the first bias control circuit 421 and the second bias control circuit 423 may be determined according to the common mode voltage set in the receiver 300. For example, when the common mode voltage set in the receiver 300 is 0.6V, the first bias control circuit 421 may increase (or decrease) the voltage level of the first received signal by 0.6V, and the second bias control circuit 423 may increase (or decrease) the voltage level of the second received signal by 0.6V.

According to some example embodiments, the DC bias voltage set in each of the first bias control circuit 421 and the second bias control circuit 423 may be a voltage level variable according to a control signal provided from the bias control unit 400.

The balance voltage detector 500 may detect voltage levels of the first transmission line TLP and the second transmission line TTL. According to some example embodiments, detection terminals of the balance voltage detector 500 may be connected to the first transmission line TLP and the second transmission line TLN positioned adjacent to each input terminal of the first bias control circuit 421 and the second bias control circuit 423. However, embodiments of the present invention are not limited thereto.

The balance voltage detector 500 may include a first comparator Comp_P and 511, a second comparator Comp_N and 512, and switches SW31 and SW32. According to some example embodiments, the first comparator 511 and the second comparator 512 may be configured in the form of an amplifier (for example, an OP-amp).

According to some example embodiments, the first comparator 511 may be a positive comparator. A voltage level of the input terminal of the first bias control circuit 421 may be input to a non-inverting input terminal of the first comparator 511. A first reference voltage Ref_P provided from the outside may be input to an inverting input terminal of the first comparator 511. The first reference voltage Ref_P may be a positive voltage. A first output voltage (e.g., a set or predetermined first output voltage) DCB_P corresponding to a result value of comparing the voltage level of the input terminal of the first bias control circuit 421 and the first reference voltage Ref_P may be output through an output terminal of the first comparator 511.

According to some example embodiments, the second comparator 512 may be a negative comparator. A voltage level of the input terminal of the second bias control circuit 423 may be input to an inverting input terminal of the second comparator 512. A second reference voltage Ref N provided from the outside may be input to a non-inverting input terminal of the second comparator 512. The second reference voltage Ref_N may be a negative voltage. A second output voltage (e.g., a set or predetermined second output voltage) DCB_N corresponding to a result value of comparing the voltage level of the input terminal of the second bias control circuit 423 and the second reference voltage Ref_N may be output through an output terminal of the second comparator 512.

The balance voltage detector 500 may include a first switch SW31 connected between the first transmission line TLP and the non-inverting input terminal of the first comparator 511, and a second switch SW32 connected between the second transmission line TLN and the inverting input terminal of the second comparator 512.

According to some example embodiments, the first switch SW31 may electrically connect or disconnect the first transmission line TLP and the non-inverting input terminal of the first comparator 511 in response to a balance failure signal BFS provided from the receiver 300. For example, when the balance failure signal BFS is the first level (that is, the high level), the first switch SW31 may be turned on to electrically connect the first transmission line TLP and the non-inverting input terminal of the first comparator 511. When the balance failure signal BFS is the second level (that is, the low level), the first switch SW31 may be turned off to electrically disconnect the first transmission line TLP and the non-inverting input terminal of the first comparator 511.

According to some example embodiments, the second switch SW32 may electrically connect or disconnect the second transmission line TLN and the inverting input terminal of the second comparator 512 in response to a balance check enable signal BCE provided from the transmitter 200. For example, when the balance check enable signal BCE is the first level (that is, the high level), the second switch SW32 may be turned on to electrically connect the second transmission line TLN and the inverting input terminal of the second comparator 512. When the balance check enable signal BCE is the second level (that is, the low level), the second switch SW32 may be turned off to electrically disconnect the second transmission line TLN and the inverting input terminal of the second comparator 512.

Meanwhile, in some example embodiments, the first switch SW31 and the second switch SW32 may be turned on or turned off at the same time. In this case, the first switch SW31 and the second switch SW32 may be turned on or turned off at the same time in response to each turn-on signal or turn-off signal.

The bias control unit 400 may include a bias controller 410 outputting a bias control bit BCB for controlling the DC bias voltage set in each of the first bias control circuit 421 and the second bias control circuit 423.

The bias controller 410 may receive the first and second output voltages DCB_P and DCB_N from the balance voltage detector 500 and the first and second reference voltages Ref_P and Ref_N from the outside, and output the bias control bit BCB such that the first bias control circuit 421 and the second bias control circuit 423 control the DC bias voltage. The bias control bits BCB output from the bias controller 410 may be provided to the first bias control circuit 421 and the second bias control circuit 423, respectively.

The first bias control circuit 421 and the second bias control circuit 423 may control the DC bias voltage and transmit a new common mode voltage to the receiver 300. Accordingly, the balance failure can be compensated and minimized.

Figure 7:
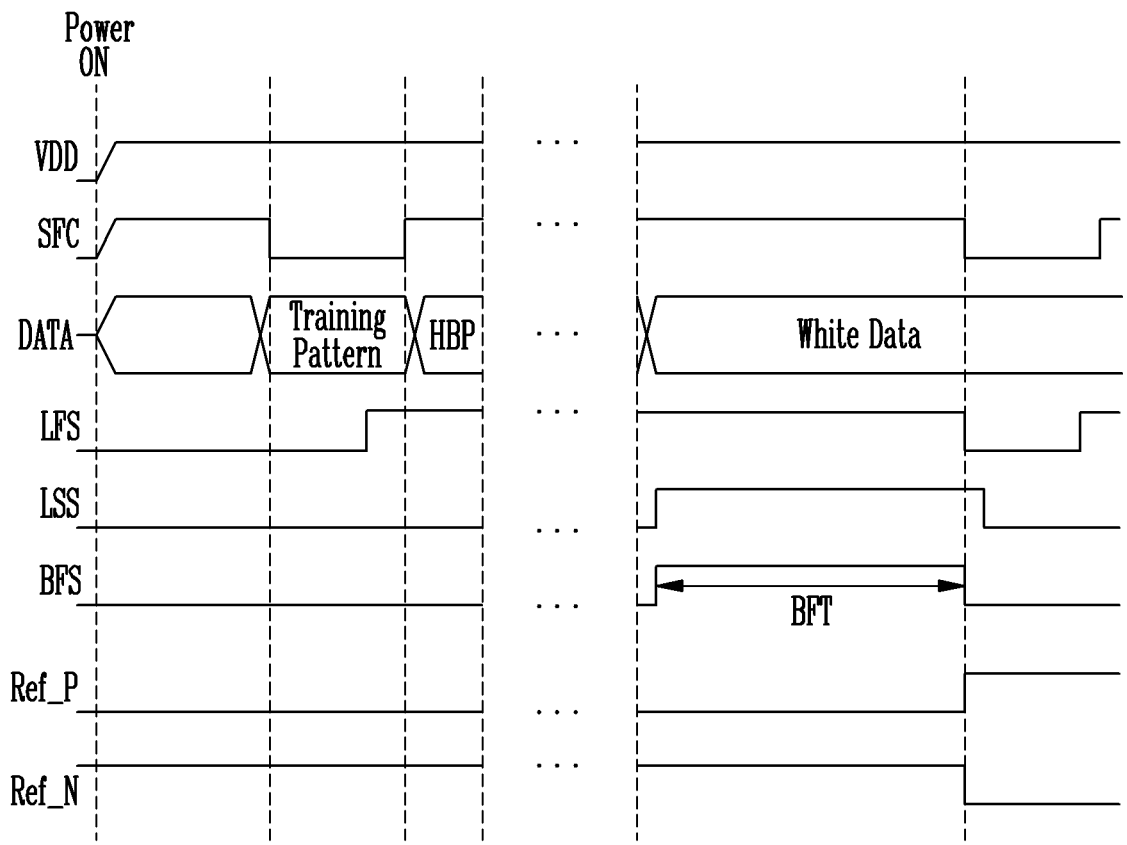
FIG. 7 is a timing diagram illustrating a method of driving an interface system according to some example embodiments of the present invention.

FIG. 7 is a timing diagram illustrating a method of driving an interface system according to some example embodiments of the present invention.

Hereinafter, a method of driving the display device 100 (refer to FIG. 1) having the white pattern as the Worst Pattern will be described as an example.

FIG. 7 illustrates a method of driving the interface system ITF when the display device 100 is powered-on.

Specifically, in FIG. 7, a method for measuring a balance failure time BFT of the transmitter 200 of the interface system ITF is specifically illustrated.

Referring to FIGS. 1 to 7, when the display device 100 is powered-on, a driving power source VDD may be changed from a low level to a high level.

The frame control signal SFC may have the low level when data of a training pattern is transmitted, and may have the high level in other cases.

The lock failure signal LFS may have the low level. When the display device 100 is powered-on, the transmitter 200 may transmit the lock failure signal LFS to the receiver 300.

In a period in which the data of the training pattern is transmitted, when a lock is successful, the transmitter 200 may not transmit the lock failure signal LFS to the receiver 300.

The transmitter 200 may transmit the data having the Worst Pattern (for example, the white pattern or the black pattern) to the receiver 300. In FIG. 7, the data having the white pattern White Data is transmitted to the receiver 300 as an example.

In this case, since a lock failure occurs, the transmitter 200 may again transmit the lock failure signal LFS to the receiver 300.

The lock start signal LSS may have the high level. When the data having the white pattern White Data is transmitted, the transmitter 200 may supply the lock start signal LSS to the receiver 300.

The receiver 300 may generate the balance failure signal BFS based on the lock start signal LSS and the lock failure signal LFS.

For example, the transmitter 200 may logically AND the lock start signal LSS and the lock failure signal LFS to generate the balance failure signal BFS. The balance failure signal BFS may be provided to the balance voltage detector 500 to turn on the first switch SW31. At the same time, the second switch SW32 may be turned on.

The balance failure time BFT may be a time from a point at which the lock start signal LSS is received to a point at which the lock failure signal LFS is received.

To identify the common mode voltage that can be problematic in the event of the lock failure and to detect the balance failure time BFT, the first reference voltage Ref_P at the low level and the second reference voltage Ref_N at the high level may be provided from the outside.

Figure 8:
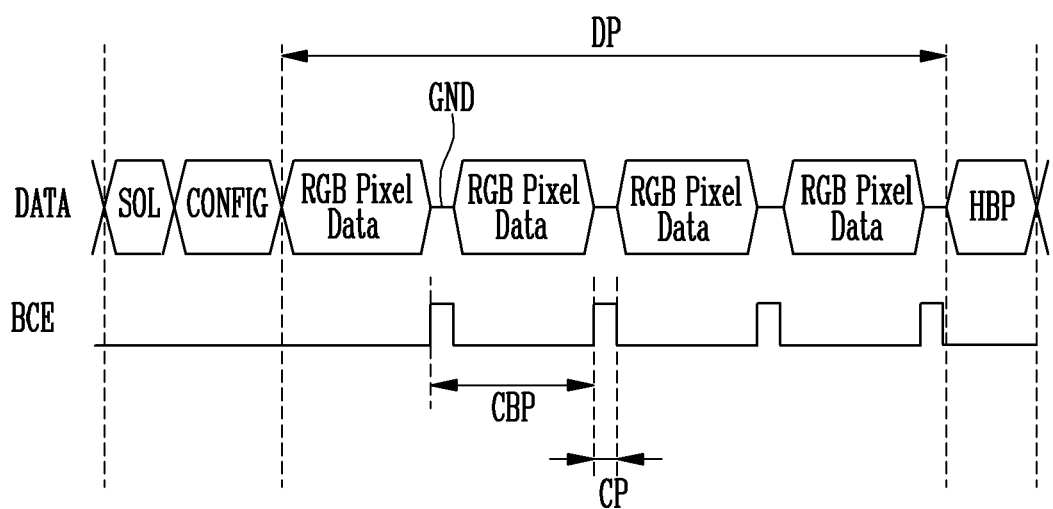
FIG. 8 is a timing diagram illustrating a method of driving an interface system according to some example embodiments of the present invention.
Figure 9:
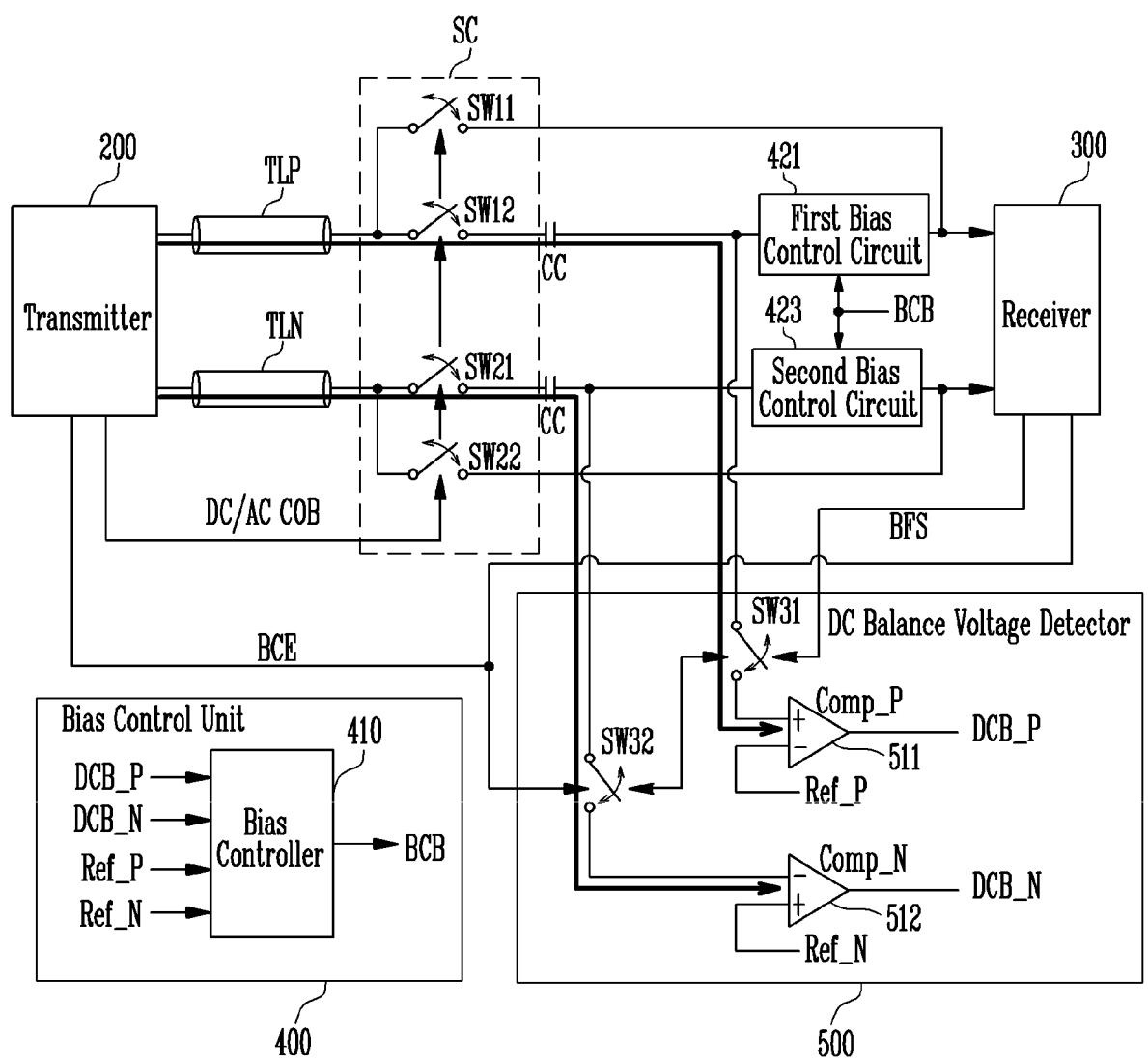
FIG. 9 is a conceptual diagram of an interface system for explaining some periods of FIG. 8.

FIG. 8 is a timing diagram illustrating a method of driving an interface system according to some example embodiments of the present invention. FIG. 9 is a conceptual diagram of an interface system for explaining some periods of FIG. 8. FIG. 10 is a timing diagram illustrating a method of driving an interface system according to some example embodiments of the present invention.

FIG. 8 illustrates a method of driving the interface system ITF when the display device 100 (refer to FIG. 1) is operated in general (real time).

Referring to FIGS. 7 to 10, according to some example embodiments, the transmitter 200 may transmit the balance check enable signal BCE for turning on the switches of the balance voltage detector 500 every period CBP. The period for providing the balance check enable signal BCE every period CBP described above will be referred to as a compensation period CP.

In each compensation period CP, the image data period RGB Pixel Data may have a voltage (for example, a ground voltage) of a reference power source GND.

In the compensation period CP, the data signal BS may include the low level bit (for example, the reference bit AD) and a middle level bit.

Data transmission is stopped in the compensation period CP, and the balance voltage detector 500 may receive the voltage level of each input terminal of the first bias control circuit 421 and the second bias control circuit 423, and detect the common mode voltages VICM through the first comparator 511 and the second comparator 512.

According to some example embodiments, the first comparator 511 may compare the first reference voltage Ref_P with the voltage level of the first transmission line TLP every compensation period CP. When the voltage level (that is, the common mode voltage VICM) of the first transmission line TLP is equal to or greater than the first reference voltage Ref P, the bias controller 410 may output the bias control bit BCB for causing the first bias control circuit 421 to reduce the common mode voltage by a DC bias voltage (e.g., a set or predetermined DC bias voltage), to the first bias control circuit 421 every compensation period CP. The first bias control circuit 421 may output the first biased common mode voltage reduced by the DC bias voltage (e.g., the set or predetermined DC bias voltage) to the receiver 300.

According to some example embodiments, the second comparator 512 may compare the second reference voltage Ref_N with the voltage level of the second transmission line TLN every compensation period CP. When the voltage level (that is, the common mode voltage VICM) of the second transmission line TLN is equal to or less than the second reference voltage Ref_N, the bias controller 410 may output the bias control bit BCB for causing the second bias control circuit 423 to increase the common mode voltage by a DC bias voltage (e.g., a set or predetermined DC bias voltage), to the second bias control circuit 423 every compensation period CP. The second bias control circuit 423 may output the second biased common mode voltage increased by the DC bias voltage (e.g., the set or predetermined DC bias voltage) to the receiver 300.

As described above, the bias control unit 400 may generate the bias control bit BCB using the first and second output voltages DCB_P and DCB_N output through the first comparator 511 and the second comparator 512 and the first and second reference voltages Ref_P and Ref_N, and provide the bias control bit BCB to the first bias control circuit 421 and the second bias control circuit 423 to generate a new common mode voltage VICM.

As described above, when the common mode voltages of the first transmission line TLP and the second transmission line TLN increase or decrease, and then become higher or lower than a specific reference level, the first bias control circuit 421 and the second bias control circuit 423 may provide the first biased common mode voltage and the second biased common mode voltage to the receiver 300, respectively. Accordingly, the balance failure caused as the common mode voltages of the first transmission line TLP and the second transmission line TLN increase or decrease can be compensated and minimized.

The interface system according to the embodiments of the present invention and the display device including the same can compensate and minimize the balance failure caused as the common mode voltages increase or decrease.

The effects according to the embodiments are not limited by the contents described above, and more various effects are included in the present specification.

As described above, the example embodiments of the present invention have been described with reference to the accompanying drawings. Those skilled in the art to which the present invention pertains will appreciate that various modifications and equivalent embodiments are possible without changing the technical spirit or scope of embodiments according to the present invention. Therefore, it is to be understood that the example embodiments as described above have been disclosed for illustrative purposes only and are not intended to limit the scope of the invention.

What is claimed is:

1. An interface system for a display device comprising: a receiver; a transmitter configured to transmit a signal including a common mode voltage to the receiver through transmission lines; a plurality of bias circuits configured to adjust the common mode voltage of the signal; and a balance voltage detector configured to detect voltages of the transmission lines, wherein the bias circuits are configured to receive a bias control bit to generate a biased common mode voltage.

2. The interface system of claim 1, wherein the balance voltage detector includes a plurality of comparators configured to compare the voltages of the transmission lines with a reference voltage input from outside.

3. The interface system of claim 2, wherein the comparators include:
a first comparator configured to compare a voltage of one of the transmission lines with a first reference voltage that is a positive voltage input from the outside; and
a second comparator configured to compare a voltage of other one of the transmission lines with a second reference voltage that is a negative voltage input from the outside.

4. The interface system of claim 3, wherein the first comparator and the second comparator are amplifiers,
wherein a voltage of a first transmission line, which is the one of the transmission lines, is input to a non-inverting terminal of the first comparator, and the first reference voltage is input to an inverting terminal of the first comparator, and
wherein a voltage of a second transmission line, which is the other one of the transmission lines, is input to an inverting terminal of the second comparator, and the second reference voltage is input to a non-inverting terminal of the second comparator.

5. The interface system of claim 4, further comprising:
a first switch connecting the non-inverting terminal of the first comparator and the first transmission line; and
a second switch connecting the inverting terminal of the second comparator and the second transmission line.

6. The interface system of claim 5, wherein the first switch is configured to be turned on in response to a balance failure signal provided from the receiver, and
wherein the second switch is configured to be turned on in response to a balance check enable signal provided from the transmitter.

7. The interface system of claim 1, further comprising:
a bias control unit configured to receive voltages output from the balance voltage detector and a reference voltage input from outside to control the bias circuits.

8. The interface system of claim 7, wherein the bias control unit includes a bias controller configured to control the bias circuits to generate the biased common mode voltage.

9. The interface system of claim 1, wherein the balance voltage detector is configured to detect the voltages of the transmission lines every compensation period having periodicity.

10. The interface system of claim 9, wherein the compensation period is included in a period in which image data is transmitted.

11. The interface system of claim 1, wherein the transmission lines include a first transmission line configured to transmit a signal of a first phase and a second transmission line configured to transmit a signal of a second phase different from the first phase.

12. The interface system of claim 1, wherein the transmitter is configured to communicate with the receiver in a differential signal method.

13. The interface system of claim 1, further comprising:
a coupling selection circuit configured to selectively provide a signals transmitted through the transmission lines to one of the bias circuits and the transmitter in response to a coupling control signal generated from the transmitter.

14. The interface system of claim 1, wherein the signal transmitted to the receiver increases or decreases, and then decreases or increases at a predetermined voltage or higher.

15. A display device comprising:
a pixel unit including a plurality of pixels;
a data driver configured to provide data signals to the pixels and including a receiver;
a timing controller including a transmitter configured to transmit a signal including a common mode voltage to the receiver through transmission lines; and
a balance voltage detector configured to detect voltages of the transmission lines of the signal including the common mode voltage,
wherein the balance voltage detector is configured to detect the voltages every compensation period having periodicity.

16. The display device of claim 15, further comprising:
a plurality of bias circuits configured to adjust the common mode voltage of the signal including the common mode voltage.

* * * * *